United States Patent [19]
Hide et al.

[11] Patent Number: 5,966,393
[45] Date of Patent: Oct. 12, 1999

[54] HYBRID LIGHT-EMITTING SOURCES FOR EFFICIENT AND COST EFFECTIVE WHITE LIGHTING AND FOR FULL-COLOR APPLICATIONS

[75] Inventors: Fumitomo Hide, Santa Barbara; Steven P. DenBaars, Goleta; Alan J. Heeger, Santa Barbara, all of Calif.

[73] Assignee: The Regents of the University of California, Oakland, Calif.

[21] Appl. No.: 08/795,190

[22] Filed: Feb. 4, 1997

Related U.S. Application Data

[60] Provisional application No. 60/032,849, Dec. 13, 1996.

[51] Int. Cl.$^6$ ..................................................... H01S 3/10
[52] U.S. Cl. ............................. 372/23; 372/39; 372/53; 372/75
[58] Field of Search .................................. 372/21, 53, 54, 372/39, 7, 23, 75

[56] References Cited

U.S. PATENT DOCUMENTS

| | | | |
|---|---|---|---|
| 5,142,343 | 8/1992 | Hosokawa et al. | 357/17 |
| 5,237,582 | 8/1993 | Moses | 372/53 |
| 5,247,190 | 9/1993 | Friend et al. | 257/40 |
| 5,408,109 | 4/1995 | Heeger et al. | 257/40 |
| 5,504,323 | 4/1996 | Heeger et al. | 250/214.1 |
| 5,553,089 | 9/1996 | Seki et al. | 372/43 |
| 5,563,424 | 10/1996 | Yang et al. | 257/40 |
| 5,677,546 | 10/1997 | Yu | 257/40 |
| 5,682,043 | 10/1997 | Pei et al. | 257/40 |
| 5,682,402 | 10/1997 | Nakayama et al. | 372/99 |
| 5,708,672 | 1/1998 | Pessot et al. | 372/23 |
| 5,798,170 | 8/1998 | Zhang et al. | 428/212 |

FOREIGN PATENT DOCUMENTS

WO95/24056 9/1995 WIPO .

OTHER PUBLICATIONS

Yang, Y., Westerweele, E., Zhang, C., Smith, P., and Heeger, A.J., "Enhanced performance of polymer light–emitting diodes using high–surface area polyaniline network electrodes", *J. Appl. Phys.*, 77 (2), Jan. 15, 1995.

Yang, Y., and Heeger, A.J., "Polyaniline as a transparent electrode for polymer light–emitting diodes: Lower operating voltage and higher efficiency", *Appl. Phys. Lett.*, 64 (10), Mar. 7, 1994.

Gustafsson, G., Cao, Y., Treacy, G.M., Klavetter, F., Colaneri, N., and Heeger, A.J., "Flexible light–emitting diodes made from soluble conducting polymers", *Nature*, 357 (6378), Jun. 11, 1992.

*Primary Examiner*—James W. Davle
*Attorney, Agent, or Firm*—Burns, Doane, Swecker, & Mathis, L.L.P.; Alan J. Heeger

[57] ABSTRACT

Hybrid inorganic light emitting device/luminescent polymer light-emitting sources for efficient and cost effective white lighting and for full-color applications and their manufacture are disclosed. The hybrid light sources include an inorganic light-emitting source such as a p-n junction diode-containing device capable of emitting a first emitted output of light and a photoluminescent polymer element positioned in the first emitted output of light, the polymer being selected to be capable of being pumped by a first portion of the first emitted output of light and when so pumped of emitting a second emitted output of light which is emitted from the device with that portion of the first emitted output remaining beyond the first portion.

38 Claims, 9 Drawing Sheets

HYBRID LIGHT-EMITTING SOURCES FOR EFFICIENT AND COST EFFECTIVE WHITE LIGHTING AND FOR FULL-COLOR APPLICATIONS

This application claims benefit of Provisional Appl. No. 60/032,849, filed Dec. 13, 1996.

REFERENCE TO GOVERNMENT SUPPORT

This invention was made in part with government support under the following: F49620-96-1-0107, a contract awarded by the Air Force Office of Scientific Research; and DMR 94-57926, a Presidential Young Investigators Grant from the National Science Foundation. The United States government has certain rights in this invention.

FIELD OF THE INVENTION

This invention relates to hybrid solid state light-emitting devices. More particularly it concerns such devices which use the emission from an electrically-powered light-emitting inorganic semiconductor device to pump photoluminescence in a suitable polymer and/or organic thin film. This results in combined emission comprising the light from the first device superimposed on the photoluminescence emission from the polymer and/or organic thin film. The color of the light out can be controlled by color mixing the two sources. Using the inorganic semiconductor device-luminescent polymer film hybrid light-emitting device of this invention, efficient white light emission or emission over a wide range of colors can be obtained.

BACKGROUND OF THE INVENTION

Solid state photonic devices are a class of devices in which the quantum of light, the photon, plays a role. Photonic devices are often classified into three categories: light sources (light-emitting diodes, lasers, diode lasers etc.), photodetectors (photoconductors, photodiodes etc.) and energy conversion devices (photovoltaic cells) [S. M. Sze, Physics of Semiconductor Devices (Wiley, New York, 1981)]. All three are important. Because photonic devices are utilized in a wide range of applications, they continue to provide a focus for research laboratories all over the world.

The solid state photonic devices function by utilizing electro-optical and/or opto-electronic effects in solid state materials. Because the interband optical transition (in absorption and/or in emission) is involved in photonic phenomena and because photon energies from near infrared (IR) to near ultraviolet (UV) are of interest, the relevant materials are semiconductors with band gaps in the range from about 1 to about 3 eV. Typical inorganic semiconductors used for photonic devices include Si, Ge, GaAs, GaP, GaN, SiC, (In,Ga)N, and the like. The Group III-nitrides, such as GaN, and (In,Ga)N have been widely studied.

In the (In,Ga)N alloy semiconductor system, the band gap can be varied from 1.9 to 3.4 eV. As a result, (In,Ga)N alloys are useful for the fabrication of optoelectronic devices operating in the wavelength range from the red to ultraviolet. Furthermore, Group III-nitrides generally are distinguished by their high thermal conductivity and physical hardness, making them suitable for high temperature applications. Group III-nitride p-n junction light-emitting diodes (LEDs) grown by metal organic chemical vapor deposition (MOCVD) emit in the blue-green spectral region.

Optical characterization of GaN has revealed that, in addition to the emission originating from the interband transition (380 nm), there is also a strong defect-mediated yellow emission around (550 nm). In general, the latter is more intense than the former; hence GaN itself is not believed to be appropriate as the emitting layer in devices. [W. Grieshaber, E. F. Schubert, I. D. Goepfert, R. F. Karlicek, Jr., M. J. Schurman, and C. Tran, J. Appl. Phys. 80, 4615 (1996).] On the other hand, by using a mixed Group III metal nitride, InGaN, as the emitting layer in an LED, the emission from the interband transition can be made to be dominant, and the emission wavelength can be tuned by varying the mole fraction of In. [S. Nakamura, M. Senoh, M. Iwasa, S. Nagahama, T. Yamada, and T. Mukai, Jpn. J. Appl. Phys. 34, L1332 (1995); H. Morkoç and S. N. Mohammad, Science 267, 51 (1995).] A number of schemes have been implemented for Group III-nitride-based LEDs, including the use of InGaN quantum wells and Zn-doped InGaN Although different colors are available from devices using InGaN as the active layer, InGaN films have proven to be difficult to grow as a result of the high volatility of indium at normal nitride growth temperatures. This makes the achievement of white light, comprised of red, green, and blue spectral regions, and/or multiple color LEDs from the InGaN system difficult and costly.

Inorganic semiconductor LEDs have recently achieved sufficiently high efficiencies that they have become competitive with other lighting technologies. Until 1995, bright blue LEDs were the missing color which prevented full-color LED based displays. Now, using Group III-nitride technology, bright blue LEDs with luminous efficiency of 6 lumens/W (7% quantum efficiency) and bright green Group III-nitride-based LEDs with luminous efficiencies over 30 lm/W (5% quantum efficiency) have been realized. The evolution over time of this LED technology is illustrated in FIG. 1.

Unfortunately, however, Group III-nitride technology has not been able to obtain bright red and yellow emission because of a serious drop in luminous efficiency at these longer wavelengths. This is shown in FIG. 2. Therefore GaN chips must be combined with AlGaInP chips to achieve white and full-color products. This multiple chip solution is costly and time consuming; a monolithic source of white light would be much more desirable.

As the quantum efficiency of the Group III-nitride LEDs is further improved from the present level of 7% to anticipated levels in excess of 15%, major opportunities will become possible; in particular, white lighting sources which are substantially more efficient than tungsten light bulbs can be anticipated.

One method of obtaining a monolithic source of white light is to combine Group III-nitride LEDs with phosphors. This approach uses the Group III-nitride source to pump fluorescent films such as ZnS and ZnCdS, as described in Y. Sato, N. Takahashi, and S. Sato, Jpn. J. Appl. Physics 35, L838 (1996). This method produces white light by using red, green and blue phosphors. A disadvantage of this technique is that the phosphors reabsorb higher energy photons, thereby reducing the net efficiency of the light emission. In addition, phosphors degrade under high drive currents and have broad emission spectra which reduce the color purity.

Conjugated polymers are a novel class of semiconductors which combine the optical and electronic properties of semiconductors with the processing advantages and mechanical properties of polymers. Semiconducting polymers typically have band gaps in the range from 1 to 3 eV. The molecular structures of a few important examples of semiconducting polymers are shown in FIG. 3. Because of the sp²p_z bonding of these planar conjugated macromolecules, each carbon is covalently bonded to three nearest neighbors (two carbons and a hydrogen); and there is formally one unpaired electron per carbon. Thus, the electronic structure (semiconductor or metal) depends on the number of atoms per repeat unit. For example the repeat unit of poly(paraphenylene vinylene), ("PPV"), contains eight carbons; PPV is a semiconductor in which the fundamental $p_z$-band is split into eight sub-bands. The energy gap of the semiconductor, the $\pi$-$\pi^*$ gap, is the energy between the highest occupied molecular orbital and the lowest unoccupied molecular orbital.

When functionalized with flexible side chains, for example, poly(2-methoxy-5-(2'-ethyl-hexyloxy)-1,4-phenylene vinylene), ("MEH-PPV"), see FIG. 3, these materials become soluble in common organic solvents and can be processed from solution at room temperature into uniform, large area, optical quality thin films [D. Braun and A. J. Heeger, Appl. Phys. Lett. 58, 1982 (1991)]. Because of the large elongation to break which is a characteristic feature of polymers, such films are flexible and easily fabricated into desired shapes that are useful in novel devices [G. Gustafsson, Y. Cao, G. M. Treacy, F. Klavetter, N. Colaneri, and A. J. Heeger, Nature 357, 477 (1992).]

Many conjugated polymers exhibit relatively high photoluminescence (PL) efficiencies with emission that is shifted sufficiently far from the absorption edge that self-absorption is minimal. The absence of self-absorption by the polymer film is a critical advantage of this invention. For example, when inorganic phosphors pumped by Group III-nitride LEDs are used with phosphors to create white light, the self absorption of the phosphor limits the overall efficiency and complicates the achievement of specific desired colors.

Light-emitting diodes have also been fabricated using semiconducting, luminescent polymers as the active materials. Thin film devices in the sandwich (multi-layer thin film) configuration comprise an active luminescent, semiconducting material laminated between two planar electrodes. One of the electrodes is made semitransparent, thereby allowing the emitting light to exit from the device. Inorganic materials (such as ZnS:Mn), organic materials such as organic dye molecules [C. W. Tang and S. A. VanSlyke, Appl. Phys. Lett. 51, 913 (1987); C. W. Tang, S. A. Van Slyke, and C. H. Chen, J. Appl. Phys. 65, 3610 (1989)] and conjugated polymers [J. H. Burroughes, D. D. C. Bradley, A. R. Brown, R. N. Marks, K. Mackay, R. H. Friend, P. L. Burns, and A. B. Holmes, Nature 347, 539 (1990); D. Braun and A. J. Heeger, Appl. Phys. Lett. 58, 1982 (1991)] have been used in this general type of electroluminescent device.

Although polymer LEDs are promising for applications in emissive displays, they suffer many serious disadvantages compared with inorganic LEDs such as those fabricated from the Group III-nitrides. In particular, the efficiencies are relatively low; quantum efficiencies are below 3% (photons per electron) and often below 1%. Moreover, the achievement of long operating life and long shelf life for polymer LEDs remains a difficult and unresolved problem. Finally, the mechanism of operation of the polymer LED requires that carrier injection be optimized and balanced by matching the electrodes to the electronic structure of the semiconducting polymer. For optimum injection, the work function of the anode should lie at approximately the top of the valance band, $E_v$, (the $\pi$-band or highest occupied molecular orbital, HOMO) and the work function of the cathode should lie at approximately the bottom of the conduction band, $E_c$, (the $\pi^*$-band or lowest unoccupied molecular orbital, LUMO). Thus, for each new polymer with a different band-gap and therefore a different emission color, a different pair of electrode materials must be developed, a tedious and difficult task.

Semiconducting, luminescent polymers are also potentially interesting as laser materials. In semiconducting polymers, the emission is at longer wavelengths than the onset of significant absorption (the Stokes shift). Because of the spectral Stokes shift between the absorption and the emission, there is minimal self-absorption of the emitted radiation [F. Hide, M. A. Díaz-García, B. J. Schwartz, M. R. Andersson, Q. Pei, and A. J. Heeger, Science 273, 1833 (1996)]. Thus, in semiconducting luminescent polymers, self-absorption does not make the materials lossy. Moreover, since the absorption and emission are spectrally separated, pumping the excited state via the $\pi$ to $\pi^*$ transition does not stimulate emission. Thus, by pumping the $\pi$ to $\pi^*$ transition, one can achieve an inverted population at relatively low pump power.

Optically pumped laser emission has been reported from MEH-PPV in dilute solution in an appropriate solvent, in direct analogy with conventional dye lasers [D. Moses, Appl. Phys. Lett. 60, 3215 (1992); U.S. Pat. No. 5,237,582]. In this application, the diluted and dissolved luminescent polymer serves as the laser dye. More recently, semiconducting polymers in the form of neat undiluted films have been demonstrated as being useful as the active luminescent materials in solid state lasers [F. Hide, M. A. Díaz-García, B. J. Schwartz, M. R. Andersson, Q. Pei, and A. J. Heeger, Science 273, 1833 (1996); N. Tessler, G. J. Denton, and R. H. Friend, Nature 382, 695 (1996)] In addition, laser action has been achieved in dilute films and solutions of semiconducting polymers containing a dispersion of titanium dioxide ($TiO_2$) nanoparticles. In this case, the nanoparticles serve to multiply scatter the emitted light such that the path length of the emitted photon exceeds the gain length above a certain excitation threshold, and an external resonant cavity is not used. [F. Hide, B. J. Schwartz, M. A. Díaz-García, and A. J. Heeger, Chem. Phys. Lett. 256, 424 (1996).] Thus, when pumped by blue emitting sources of sufficient intensity (for example by Group III-nitride or ZnSe based LEDs or Group III-nitride or ZnSe based laser diodes), electrically pumped laser emission can be realized for colors spanning the entire visible spectrum.

Construction of solid state lasers using semiconducting (conjugated) polymers requires that two criteria be fulfilled: First, the active polymer medium must exhibit stimulated emission (SE) when excited optically or electrically; second, some type of resonant structure must enable the emitted photons to travel a distance greater than the gain length in the excited polymer. The requirement that the emitted photons must travel distances longer than the gain length in the excited medium, can be achieved by using resonant structures; for example, cavities or waveguides. Diverse methods, including external mirrors, distributed feedback (DFB), dielectric mismatch reflection, and microcavities are commonly used. The use of semiconducting polymers as materials for solid state lasers has been disclosed in detail in U.S. Patent Application 60/022,164, [titled Conjugated Polymers as Materials for Solid State Lasers]; incorporated herein by reference.

STATEMENT OF THE INVENTION

A hybrid light source has now been discovered. This hybrid light source includes an electrically-powered, solid state, inorganic, light emitter capable of emitting a first emitted output of light. It also includes a photoluminescent polymer element positioned in the first emitted output of light. The photoluminescent polymer is selected to be capable of being pumped by a first portion of the first emitted output of light. When it is so pumped it emits a second output of light which is emitted from the device together with that portion of the first emitted output remaining beyond the first portion.

The electrically-powered, solid state, inorganic, light emitter can be selected from a wide range of devices including, without limitation, a p-n junction diode-containing light emitter, a p-n junction triode-containing light emitter, a p-n junction laser diode light emitter, a metal-insulator-semiconductor (M-I-S)-containing light emitter, and a semiconductor quantum cascade pump source light emitter.

The present invention provides a highly efficient white or multiple color source by combining the photoluminescence from polymer and/or organic films with the emission from a high efficiency, solid state, inorganic light emission source. When the inorganic light emission source is a Group III-nitride-based LED or laser it provides a blue component and, simultaneously, serves as a short wavelength pump source for exciting the photoluminescence of the polymer and/or organic film(s) to provide the longer wavelength components necessary for a white light output. These various pump sources already noted can all generate light with a wavelength less than that of the light emitted by the light-emitting polymer and thus can be used to generate efficient white light.

The polymer and/or organic film(s) can be mounted directly on the LED or laser and included within the LED or laser package. For example, a luminescent polymer film can be spin-cast from solution directly onto the sapphire substrate of a Group III-nitride LED. The hybrid light-emitting device invention has a number of specific advantages:

High reliability of the inorganic first light sources such as the p-n junction-based, e.g. Group III-nitride-based, pump source.

High overall power efficiency due to the specific absorption and emission characteristics of the polymer/LED combination.

Energy efficient white lighting

Compact white or multiple color light source

Heat and power dissipation in the robust LED/ sapphire structure

Robust metallization and electrical contact to the LED pump

Large area displays enabled by the flexible and economical polymer film

Uniform and reproducible color purity.

Electrically-pumped diode lasers can produce emission colors throughout the visible wavelength spectrum using the Group III-nitride/semiconducting polymer hybrid which is the subject of this invention. In this laser application, the intense blue emission from the Group III-nitride light-emitting diode is used to pump a polymer (or, more generally, an organic) film above the gain narrowing threshold. In this application, it might be advantageous to pulse the GaN-based LED so as to achieve the desired high pump brightness. In addition, it might be advantageous to include the polymer film in a resonant structure such as described U.S. Patent Application 60/022,164.

There is a particular advantage to the combination of these two light sources into a single hybrid unit. Because of the large joint density of states associated with the direct $\pi$ to $\pi^*$ (interband) transition of these quasi-one-dimensional, semiconducting polymers, the absorption coefficient (a) is large, typically a $>10^5$ cm$^{-1}$ [A. J. Heeger, S. Kivelson, J. R. Schrieffer, and W.-P. Su, Rev. Mod. Phys. 60, 781 (1988)]. Derivatives with bulky side chains (such as MEH-PPV, BCHA-PPV, and the like, see FIG. 3) are often used to obtain solubility in common organic solvents. Such bulky side chains dilute the conjugated backbone within the polymer. As a result, the absorption coefficient is reduced somewhat to values of order $10^5$ cm$^{-1}$. Thus, in the vicinity of the blue emission from Group III-nitride, the optical absorption depth, $L_a=a^{-1}$ of conjugated polymers is typically less than 100 nm (that is, less than 1000 Å). We have now found that the blue emission from Group III-nitride LEDs or from Group III-nitride laser diodes serves as an efficient pump source for exciting the photoluminescence of conjugated polymers.

In this invention, we overcome the limitations of the prior art and demonstrate that highly efficient white or multiple color emission can be obtained by combining the photoluminescence from polymer and/or organic films with the emission from a high efficiency light-emitting device such as a Group III-nitride based LED or laser. The Group III-nitride based LED provides the blue component and, simultaneously, serves as the short wavelength pump for exciting the photoluminescence of the polymer and/or organic film(s). If desired, the blue light from the Group III-nitride pump can be totally absorbed and re-emitted as light of a different color by using thicker polymer and/or organic films. Alternatively, any desired fraction of the Group III-nitride emission can be included in the output by careful selection of the thickness of the polymer and/or organic film.

In other aspects this invention provides hybrid light emission units in which SiC or II-VI compound (for example ZnSe) semiconductor-based LEDs are used for pumping semiconducting polymers. The demonstration of green LEDs and blue laser diodes using ZnSe based devices indicates the possibility of obtaining highly luminescent emission from luminescent polymers using such laser diodes as the pump source as well.

The luminescent polymer material can be present as a simple body or as a simple layer. Alternatively, it can serve as the gain medium in a resonant structure. In this case the inorganic first light source and the photoluminescent polymer are selected so that the first light source's first emitted output of light pumps the photoluminescent polymer element above its threshold for lasing. In this embodiment, the resonant structure can be a planar or channel waveguide, with or without distributed feedback or it can be a mirocavity.

In yet additional aspects this invention provides methods for forming the hybrid devices in which the luminescent polymer is affixed to the light emmisison zone of the first light source by direct attachment, by spin-casting, by in situ polymerization, or the like.

BRIEF DESCRIPTION OF THE DRAWINGS

This invention will be described with reference being made to the drawings in which.

DESCRIPTION OF THE PREFERRED EMBODIMENTS

This invention utilizes the emission from light-emitting devices including light-emitting diodes and triodes, M-I-S LEDs, laser diodes and quantum cascade light emission sources (and in preferred embodiments blue or blue-green light-emitting diodes or blue or blue-green laser diodes) to pump the photoluminescence of polymer and/or organic thin films. This yields a combined emission made up of light emitted from the pump device superposed on the photoluminescence emission for the polymer and or organic thin film(s). The color of the light out can be controlled by color mixing well known in the art. Using the blue or blue-green LEDs in combination with luminescent polymer films as described in this invention, efficient white light emission or emission with a wide range of colors can be obtained.

Representative Hybrid Device Configurations having a Pump Source and a Luminescent Polymer The hybrid devices of this invention include an inorganic semiconductor light emitter as a pump for a luminescent polymer.

Figure 4:
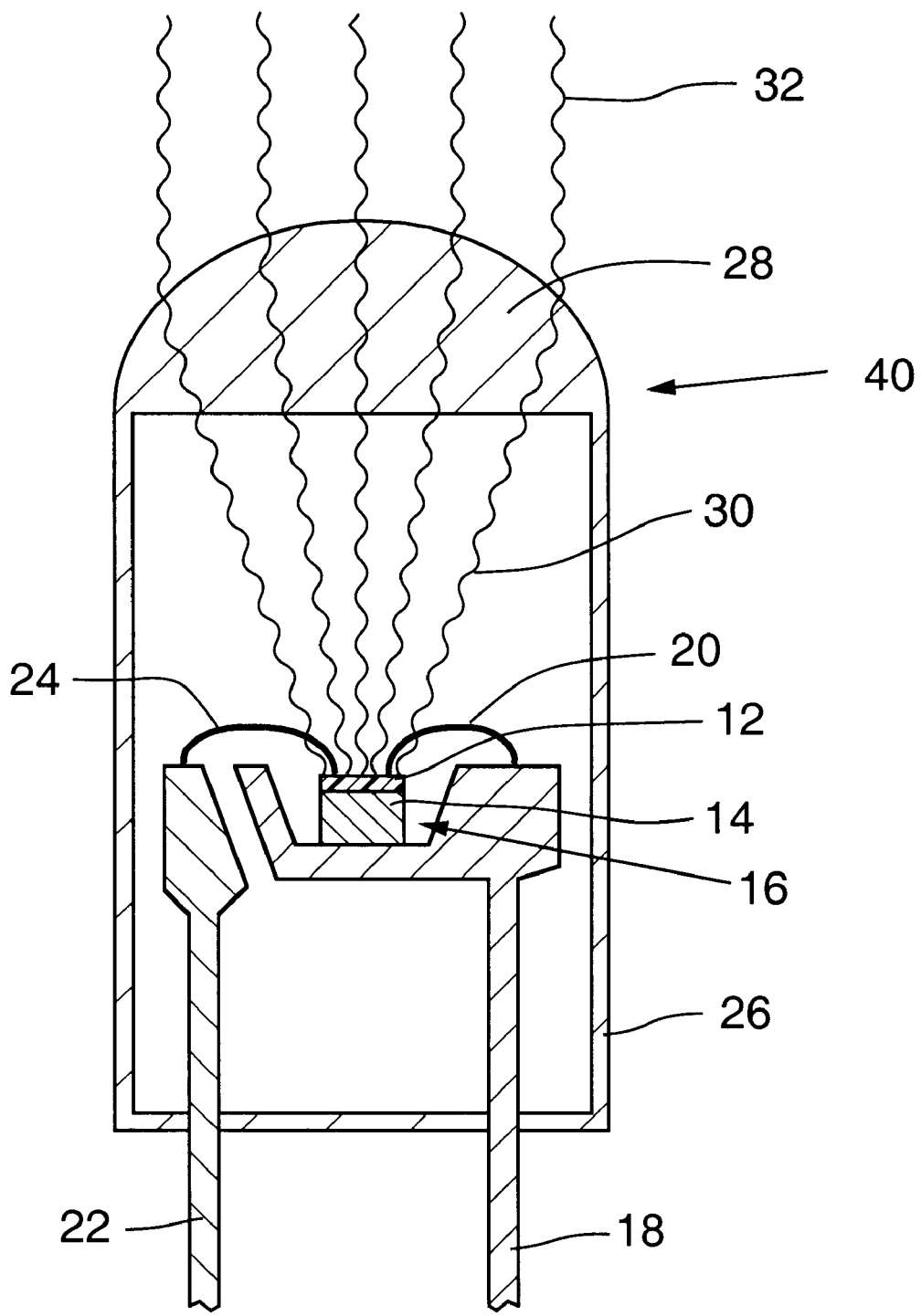
FIG. 4 is a schematic cross sectional view of the architecture of a typical p-n junction LED such as a Group III-nitride LED.

A typical semiconductor light-emitting device of the art 10 is depicted as in FIG. 4. Device 40, is shown as a Group III-nitride LED. In contains a thin layer (50–10,000 angstroms, and especially 200 to 2000 angstroms) 12 of a group III nitride carried by a robust support 14, made of a material such as sa sapphire. This support is carried, in turn, by reflector dish 16 on cathode post 18. An electrical connection 20 connects the cathode to the Group III nitride layer 12. An anode post 22 is electrically connected via 24 to the layer 12, as well. An enclosure 26 is provided to protect the LED components. This enclosure can be plastic, glass, epoxy or the like. Commonly it will include a focussing lens 28 with collects the relatively diffuse emitted light output 30 and focusses it into a more directed beam 32. When a suitable voltage is applied across the anode and cathode, light 30 is emitted from layer 12. In the case of Group III-nitride layers, the light emitted is relatively short wave length in the blue to blue green portion of the spectrum.

Figure 5:
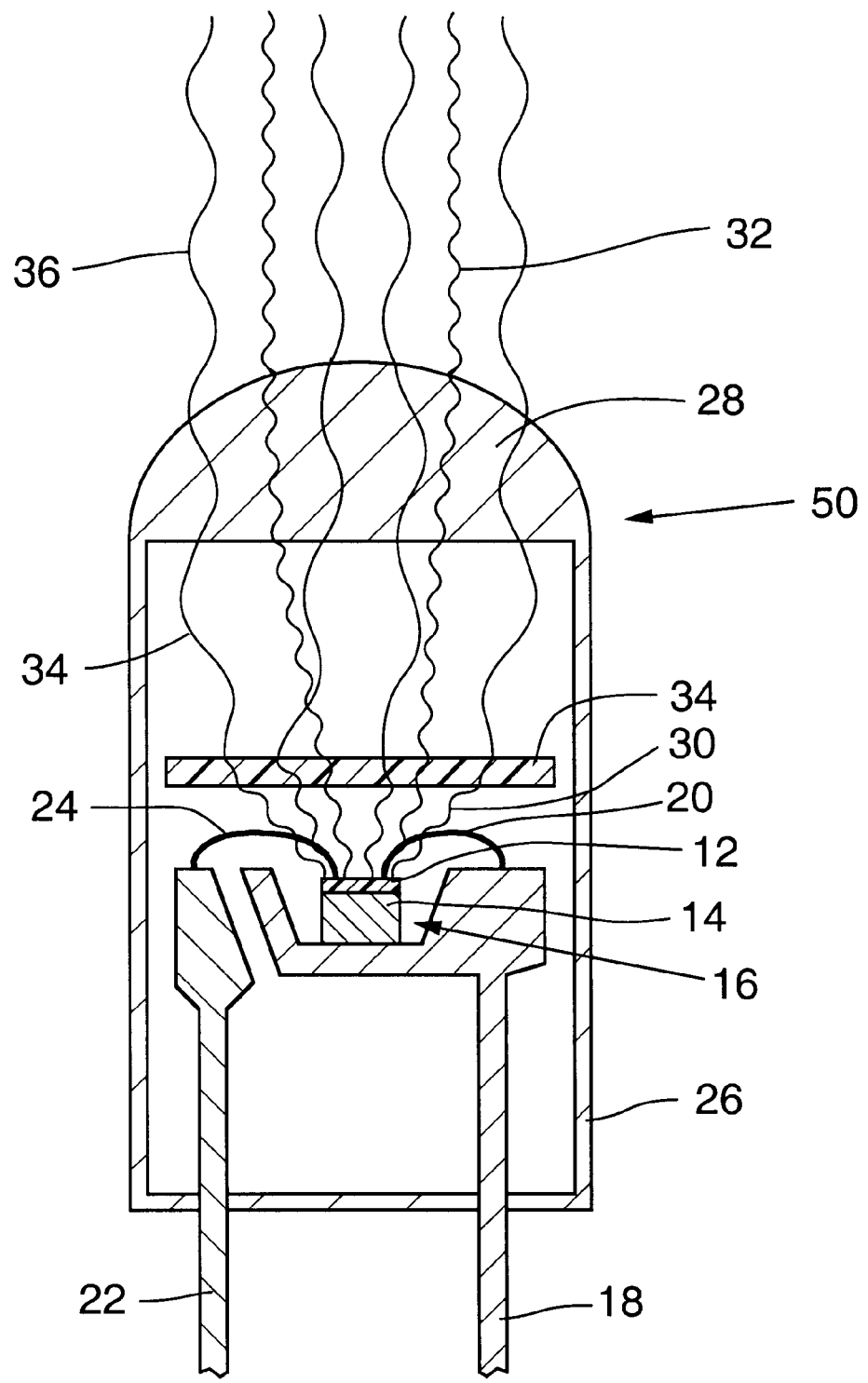
FIG. 5 is a schematic cross sectional view of the architecture of a hybrid device of this invention having a p-n junction LED and a photoluminescent polymer film.

Turning now to FIG. 5, a hybrid device 50 of the invention is shown. This device has all the same elements and light outputs 12–32 as depicted in FIG. 4. It additionally includes photoluminescent polymer film 34 which is positioned in the path of light output 30. In this configuration, the LED serves as a pump source for the photoluminescent polymer layer 34. At least a portion of light output 30 is absorbed by layer 34 and used to pump it to a state of photoluminescence. This gives rise to light emission 36. which could be of a similar wavelength to emission 30, but typically is of a longer wavelength. Emission 36 is gathered by lens 28 and emitted coincidentally with emission 32. The combination of these two wavelengths can be used to generate a range of colors based on the wavelengths and proportional intensities of the two emissions. Layer 34 can be neat photoluminescent polymer or can be a mixture of a photoluminescent polymer with bulk polymers. This layer is typically carried by a support, not shown, which is designed to carry the polymer and allow both light emissions 30 and 34 to pass.

One could, if desired, obtain even greater light emission variety by using multiple layers of different photoluminescent polymers or using mixtures of materials in the polymer layer or in the LED junction device.

Device 50 is but one possible configuration. Layer 34 can be located anywhere in light beam 30, such as under Group III-nitride device support 14, as is shown in device 60 in FIG. 6, on top of layer 12, on lens 28 or the like.

In this diode device a number of possible configurations are possible; the best configuration for a specific application will depend on the requirements of that application. Disclosed herein are several specific configurations that will lead to efficient pumping of the polymer by the blue or blue-green LED pump source and to efficient collection of the total emitted light; i.e. from the source and the luminescent polymer, but other configurations are possible.

The emission from an LED, such as is shown in FIG. 5, is divergent. Therefore, in order to capture more of the emitted light and to obtain the desired spectrum, in one embodiment, the epoxy lens of the LED lamp (see FIG. 4) can be externally coated with a photoluminescent polymer film.

In one preferred embodiment, the epoxy lens of the lamp is split, a polymer film is inserted and the lamp is glued back together as shown in FIG. 5. This embodiment is preferred because luminescent polymers are known to be photo-oxidatively unstable. Thus, it is desirable and often necessary to keep such films free of oxygen when optically pumping them.

Figure 6:
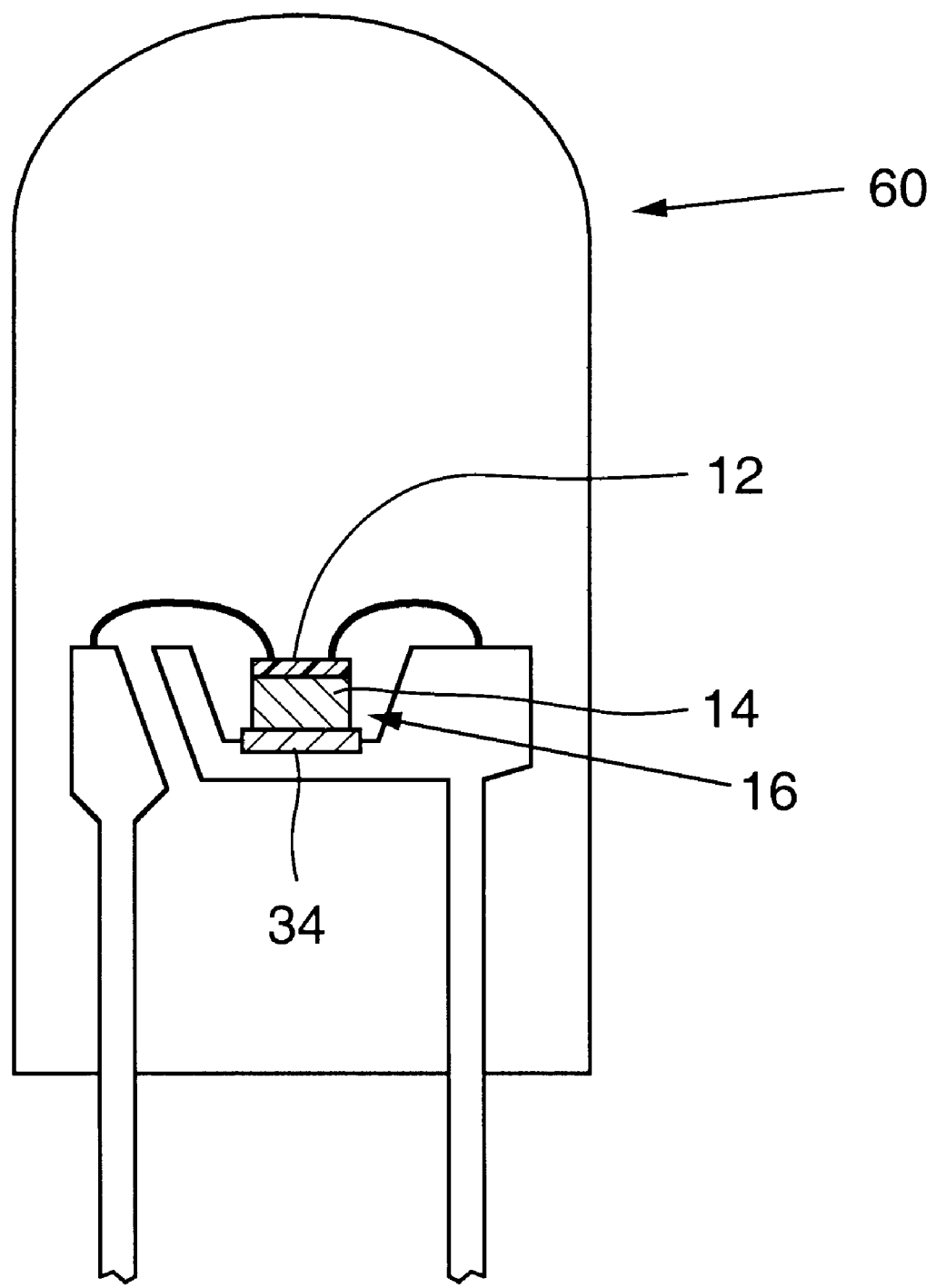
FIG. 6 shows another schematic view where the luminescent polymer film can be placed inside the LED package in the immediate vicinity of the LED chip.

In yet a more preferred embodiment, the luminescent polymer film can be placed inside the LED package in the immediate vicinity of the LED, as shown in FIG. 6. Since most of the emission from the Group III-nitride LED emerges from the bottom of the sapphire substrate, this configuration tends to optimize the coupling of the pump source to the luminescent polymer. There are several alternative possibilities for this configuration:

a) After the processing of the Group III-nitride-based LEDs, the LED chips can be cut from the substrate to final size (for example, to approximately 300 microns square). In a similar manner, the semiconducting polymer can be spin-cast or drop cast onto a suitable substrate, and diced into the same desired size. The LED chip and the polymer film are then glued back to back, and then this composite is encapsulated in a single package.

b) After the Group III-nitride processing, the LED wafer is turned upside down and a polymer film is cast onto the sapphire substrate side. After the polymer film has been formed, the wafer can be cut into LED chips using a dicing saw. The polymer film can be drop-cast or spin-cast from solution.

c) Possible improvements to embodiments a) and b) above include the following: The polymer layer is somewhat fragile. Thus, after the fabrication of the polymer film on the sapphire wafer or on a separate substrate, the polymer film can be overcoated with another more robust polymer film, with silicon dioxide, or with any other protective coating well known in the art for the purpose of protecting the polymer during the dicing of the substrate.

d) Additional possible alternatives to embodiments a) and b) above: Since contacts cannot be made through the sapphire substrate side, both the anode and cathode contacts to the Group III-nitride LED are on the top. The p-type contact metal can be made deliberately thin (100 angstrom units or so) so that it is semitransparent and thereby allows some light to escape through the top side as well as through the bottom side. Thus, the polymer layer can be drop cast or spin-cast onto the top side of the chip after the contacts have been made.

e) Since most of the emission emerges from the bottom side, the LED chip is housed in a reflector dish that reflects the emitted light in the desired direction (see FIG. 4). Using this standard configuration, the reflector dish can be coated with a luminescent polymer layer or with multiple layers comprising different luminescent polymers, the constituents and thicknesses of the layers within the multilayer chosen so as to achieve the desired white light or colored light.

While these three representative constructions have all employed an LED as the inorganic first light emission source, other inorganic pump sources, as described herein and in the art could be substituted.

The Pump Source

Group III-nitrides comprising Al, Ga and In are of particular interest as materials for LEDs, light-emitting triodes and laser diodes which can be used as the pump source in this invention. Group III-nitrides are distinguished by their high thermal conductivity and physical hardness, making them suitable for high temperature applications. Group III-nitride p-n junction light-emitting diodes grown by metal organic chemical vapor deposition (MOCVD) emit in the blue-green spectral region. Thus, Group III-nitride p-n junction LEDs grown by MOCVD are excellent pump sources for use in this invention. Alternative blue or blue-green pump sources include SiC, and II-VI compound semiconductor-based LEDs using materials such as ZnSe. The Group III-nitride and, specifically, (In,Ga)N LEDs are preferred because of their improved performance over LEDs fabricated from SiC, and II-VI compound semiconductor-based LEDs using materials such as ZnSe. A typical configuration for the Group III-nitride LED is shown in FIG. 4.

In addition to LEDs, laser diodes made from Group III-nitride or, alternatively from II-VI compound semiconductors such as ZnSe are excellent narrow band sources with high intensity and suitable for use as the pump source in this invention.

In addition to Group III-nitride p-n junction diode pump sources and the like, high efficiency metal-insulator-semiconductor (MIS) LEDs, p-i-n triodes, p-n laser diodes, and quantum cascade GaN/AlGaInN based light-emitting structures can also be used. These structures are known in the art. In particular, MIS LEDs can be used to generate wavelengths from the deep UV (200 nm) which may have better conversion efficiencies than GaN (360 nm) or InGaN (360–620 nm) for some polymers or polymer blends. GaN/AlN quantum cascade structures can also be utilized because of their ability to generate light using majority carrier photon emission without a p/n junction or without the need for p-type GaN materials.

The Luminescent Polymer

Many conjugated polymers exhibit relatively high photoluminescence (PL) efficiencies with emission that is red-shifted sufficiently far from the absorption edge that self-absorption is minimal. High photoluminescence efficiency and the absence of self-absorption by the polymer film are critical advantages; polymers which have these two features are preferred for use in this invention.

Figure 3:
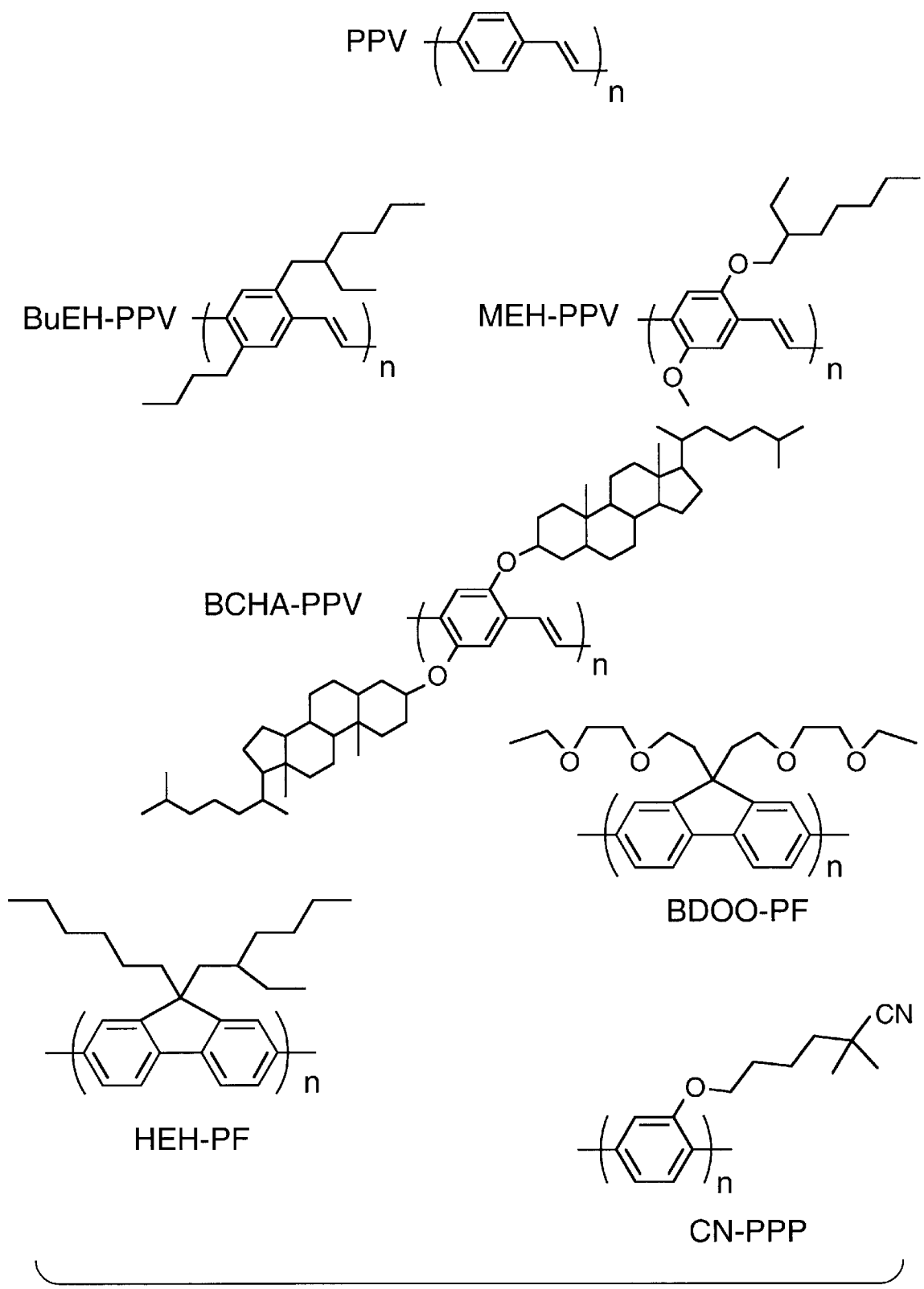
FIG. 3 shows the molecular structure of a few examples of semiconducting luminescent polymers useful in this invention.

Semiconducting polymers useful in this invention typically have band gaps in the range from 1 to 3 eV. The molecular structures of a few important examples of luminescent semiconducting polymers are shown in FIG. 3. These are to be considered examples only; other structures include the polythiophenes and the poly(pyridine vinylenes). Any luminescent polymer with good film forming properties and good stability can be used as the luminescent film in this invention.

The sub-class of conjugated polymers with the backbone molecular structure of poly(phenylene vinylene), PPV, are useful in this invention; see FIG. 3. Films of the parent polymer, PPV, are fabricated by the precursor technique; a precursor polymer is cast from the solution followed by high temperature heat treatment to convert to the conjugated structure [see, for example, J. H. Burroughes, D. D. C. Bradley, A. R. Brown, R. N. Marks, K. Mackay, R. H. Friend, P. L. Burns, and A. B. Holmes, Nature 347, 539 (1990)]. The final film is therefore intractable and stable at high temperatures. Because the Group III-nitride LEDs operate at relatively high temperatures, the high temperature stability of luminescent polymer films fabricated by the precursor route is an advantage for this invention.

Figure 1:
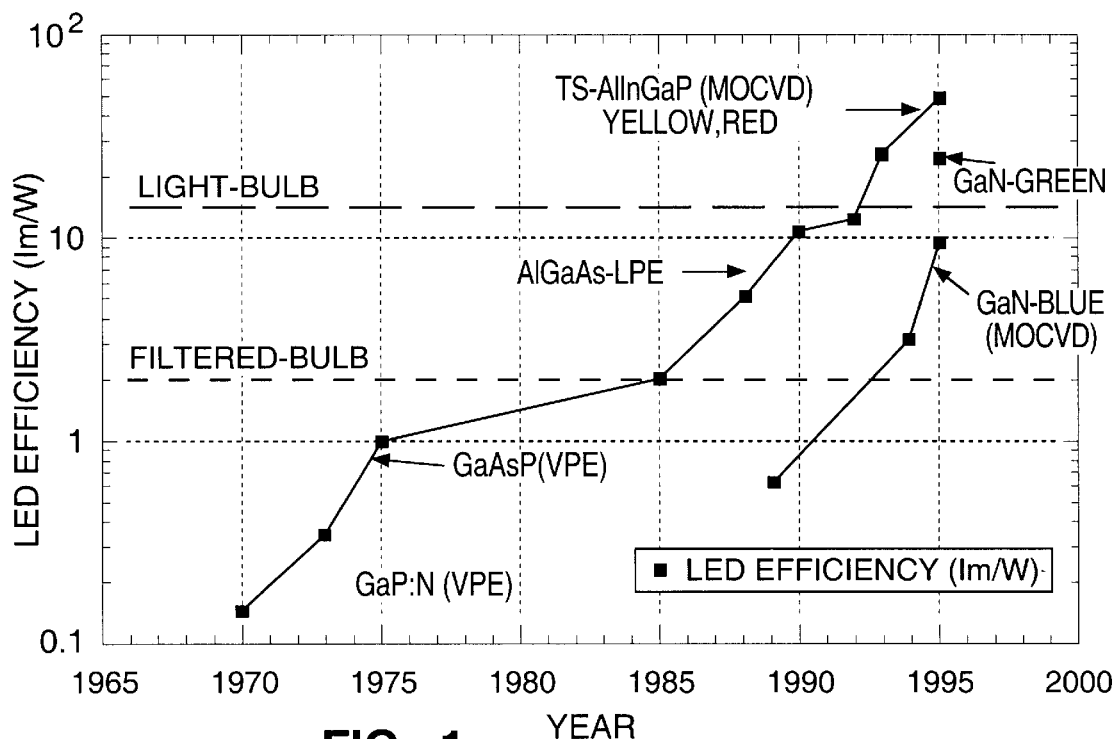
FIG. 1 is a chronological depiction of the evolution of Group III-nitride LED efficiency in comparison to other III-V semiconductors and tungsten light bulbs (60 W)
Figure 2:
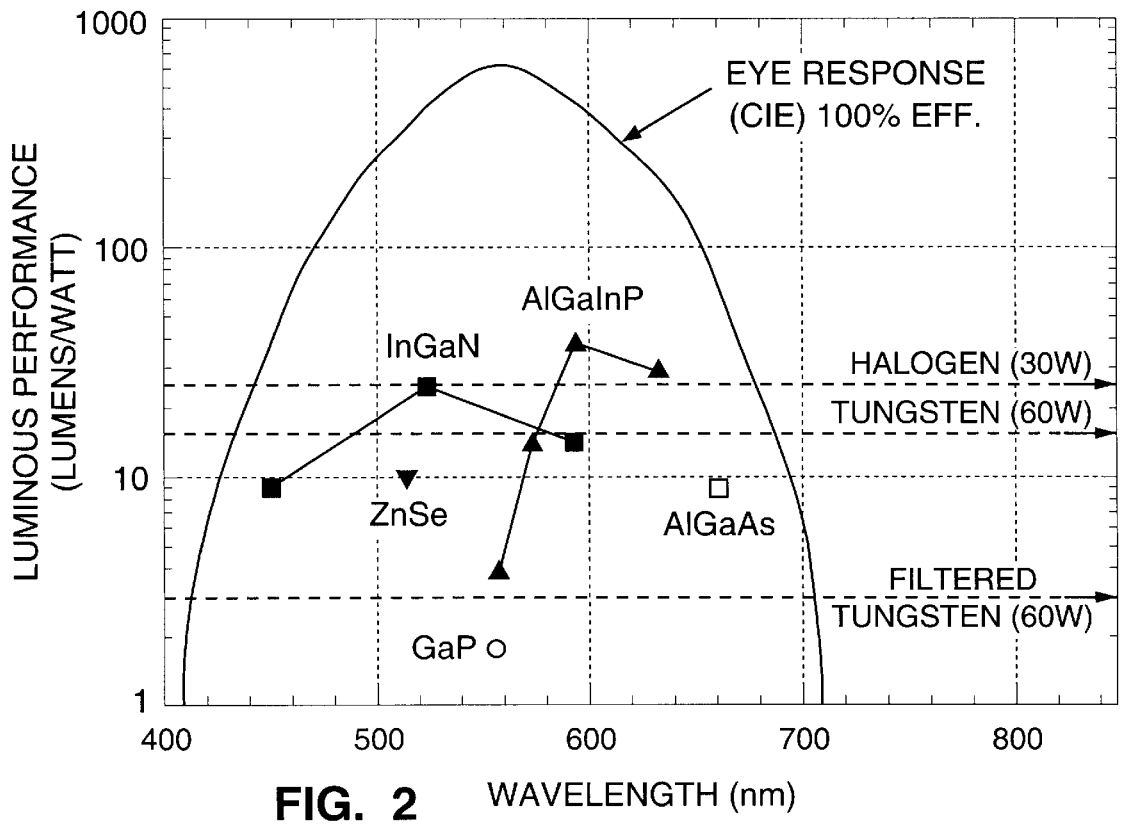
FIG. 2 is a comparison of Luminous Efficiencies of inorganic LEDs with visible emission.

When functionalized with flexible side chains [for example, poly(2-methoxy-5-(2'-ethyl-hexyloxy)-1,4-phenylenevinylene), MEH-PPV; see FIG. 2], these materials become soluble in common organic solvents and can be processed from solution at room temperature into uniform, large area, optical quality thin films. Luminescent polymers which are processable into optical quality thin films are preferred for use in this invention.

Saturated polymers mixed with luminescent dyes and saturated polymers with luminescent dye molecules attached to the main chain as side-chains are also useful in this invention. However, since it is advantageous to have high chromophore density in the polymer, conjugated polymers are generally preferred over dye-containing saturated polymers, over blends of saturated polymers with conjugated polymers, or over copolymers containing both conjugated and saturated units.

Thin films comprised of luminescent small molecules are also useful in this invention. Examples include the full range of luminescent small molecules used in light-emitting diodes such as, for example, the organic dye molecules described by C. W. Tang and S. A. Van Slyke [Appl. Phys. Lett. 51, 913 (1987)], and the like. In this context, the term "small molecule" means a molecular system in which the vapor pressure is sufficiently high at temperatures below the temperature required for thermal decomposition to enable the formation of thin films by vapor deposition. When using such small organic dye molecules, the optical quality thin films must be fabricated by vapor deposition, because small molecules are not good film-formers. Since vapor deposition in vacuum is an expensive and time-consuming step, luminescent, conjugated polymers that can be cast from solution are preferred for many applications.

In the embodiments described, the luminescent polymer is presented as a layer, a coating or as a solid body. In a specialized application, the luminescent polymer can serve as the gain medium in a resonant structure and the p-n junction diode device and the photoluminescent polymer are selected so that the p-n junction diode device's first emitted output of light pumps the photoluminescent polymer element above its threshold for lasing. In this embodiment, the resonant structure can be a planar or channel waveguide, with or without distributed feedback or it can be a mirocavity.

In all the embodiments described herein, various additional layers and elements known to be useful in the use and fabrication of light-emitting diodes, laser and photoluminescent devices may be present. These can include various protective hardcoat layers such as may be formed out of transparent organic and inorganic materials. They can also include electrical contact layers which may be transparent or not as required or permitted. These contact layers can include metal layers, conductive metal compound layers and conductive polymeric layers as are taught in the art. The electroluminescent layer can also contain particles coated upon it of dispersed in it to diffuse the emitted light, if desired.

This enumeration of specific configurations for implementation of the basic invention comprising hybrid light-emitting devices is neither exhaustive nor all inclusive. Other potentially useful configurations will become evident to those knowledgeable in the art.

EXAMPLES

The following examples show various of implementations of the invention. They are intended to be illustrative and not to limit the scope of the invention as defined by the aspects or claims.

Example 1

This example demonstrates that high luminance blue green light can be realized with a Group III-nitride LED with Zn-doped InGaN as the emitter layer. As a general procedure throughout these Examples, the emission of the blue green light was characterized in terms of the emission spectrum. After taking into account the psychophysical response of the human eye, the color of emission was determined according to the CIE (1931) coordinates. References on the topic of human response and color theory are: G. A. Agoston, "Color Theory and Its Application in Art and Design," Springer Verlag, 1987, Heidelberg; R. W. G. Hunt, "The Reproduction of Colour," Foutain Press, 1975, London; W. N. Sproson, "Colour Science in Television and Display Systems," Adam Hilger, 1983, Bristol (UK). In subsequent examples, we demonstrate that this color can be tuned by means of the description of this invention.

The Group III-nitride LED fabricated with Zn-doped InGaN and peak emission at 470 nm was powered by a regulated power supply that provided a constant current of 20 mA. The LED was encapsulated in transparent epoxy in a manner standard in the art, as sketched in FIG. 4. The epoxy was shaped in such a way that it acted as a magnifying lens that made the LED luminescence appear brighter to the eye. Since the sapphire substrate is transparent to visible light, most of the emitted light passed through the substrate and was reflected through the epoxy lens by the back reflector. In addition, the metallic thin films used as contacts on the top of the device were of thickness of only 100 Å. Consequently, light also was transmitted through this side. Both light from the back and from the front sides of the LED were collected by the epoxy lens. In addition, an external lens was placed in front of the diode in order to collimate the emerging beam as much as possible. The collimated beam passed through an iris that spatially filtered light not sufficiently parallel to the optical axis. The spatially filtered light was frequency dispersed via a single monochromator (Spex) and recorded on a thermoelectrically cooled CCD array (Photometrics). The experiments reported in this Example and in the Examples which follow were performed at room temperature and in ambient atmosphere.

Figure 7:
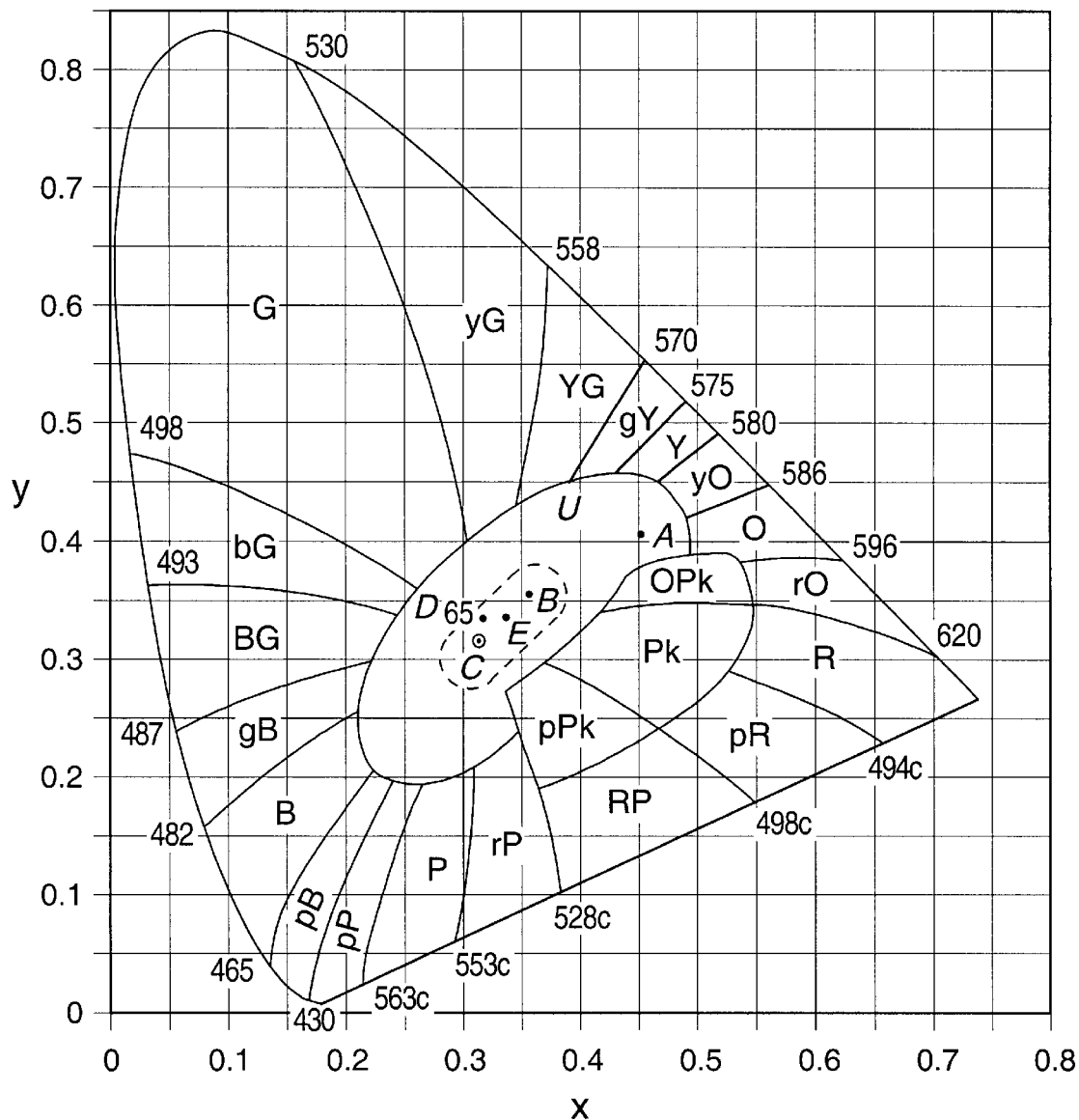
FIG. 7 is a CIE chromaticity diagram.

The emission spectrum was measured in the manner described above; the peak of the emission from the Zn-doped InGaN LED was blue-green and centered at 470 nm. The CIE coordinates which characterize the emission are (x,y)=(0.258, 0.467). The CIE chromaticity diagram is shown in FIG. 7.

Example 2

Figure 8:
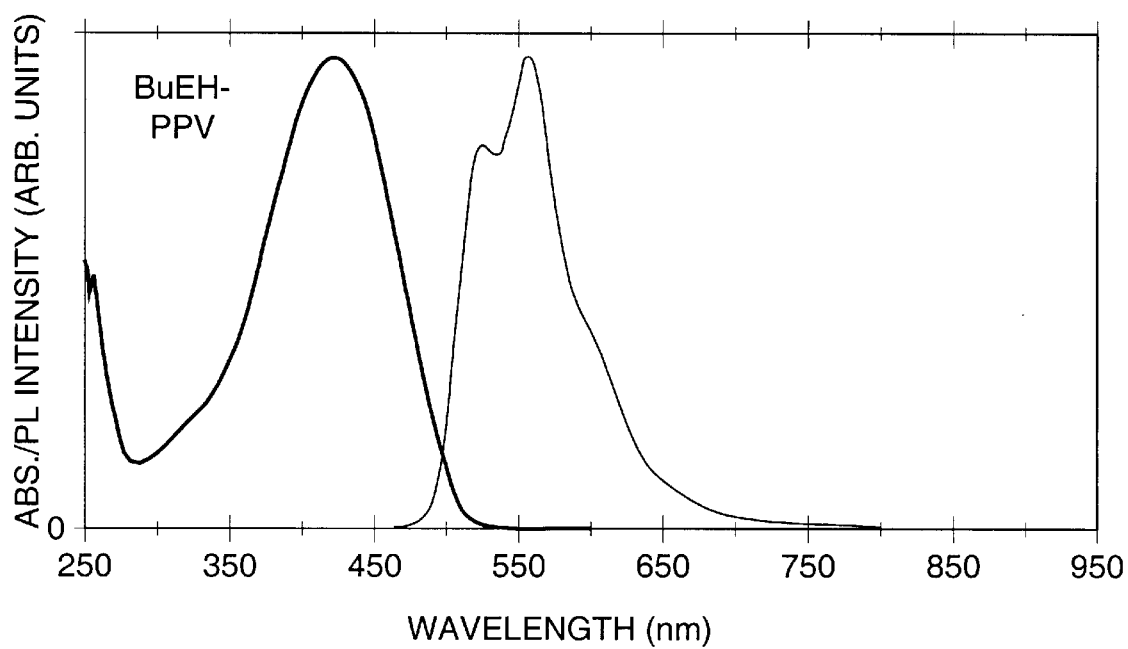
FIG. 8 is an absorption spectrum and photoluminescence spectrum of the chemical structure BuEH-PPV.

BuEH-PPV is a highly luminescent semiconducting polymer with chemical structure, ground state absorption spectrum, and steady state photoluminescence spectrum as shown in FIG. 8. A solution of BuEH-PPV in p-xylene, at a concentration of 1% w/v, was prepared by stirring at room temperature in a sealed environment where the oxygen level was minimized by a constant flow of high purity nitrogen. The solution was vigorously stirred until the polymer was dissolved.

A glass substrate for film preparation was obtained by cutting a commercially available microscope slide (7.5 cm×2.5 cm×1 mm) into a 1.5 cm×1.5 cm square. The substrate was cleaned by sonication in reagent grade acetone for 20 minutes followed by sonication in reagent grade 2-propanol for 20 minutes. The substrate was then dried in an oven at 170° C. and introduced into the nitrogen chamber via a vacuum port.

The nitrogen chamber was equipped with a spin coating apparatus which allows film preparation to be carried out in the inert environment. A thin film of BuEH-PPV (optical density (OD)=0.86 at $1_{max}$(absorption)=416 nm) was spin-cast from solution onto the substrate using this spin coater. The film was stored in the nitrogen chamber until immediately before the optical characterization experiments described below.

The film was placed 1 cm away from the collimating lens in the optical path of the light emitted from the 470 nm Zn-doped InGaN LED described in Example 1. Thus, the film was optically pumped by the 470 nm GaN LED, and any light that was recorded consisted of emission of BuEH-PPV pumped by the 470 nm LED plus any light from the LED that was not absorbed by the BuEH-PPV film and was transmitted. The emission spectrum was slightly red-shifted relative to that of the 470 nm GaN-based LED alone as a result of the BuEH-PPV film; the emission spectrum is centered around 500 nm, and the CIE coordinates are now (0.259, 0.557). The color is a purer green than that emitted by the 470 nm Zn-doped InGaN LED alone (see in Example 1).

Example 3

Figure 9:
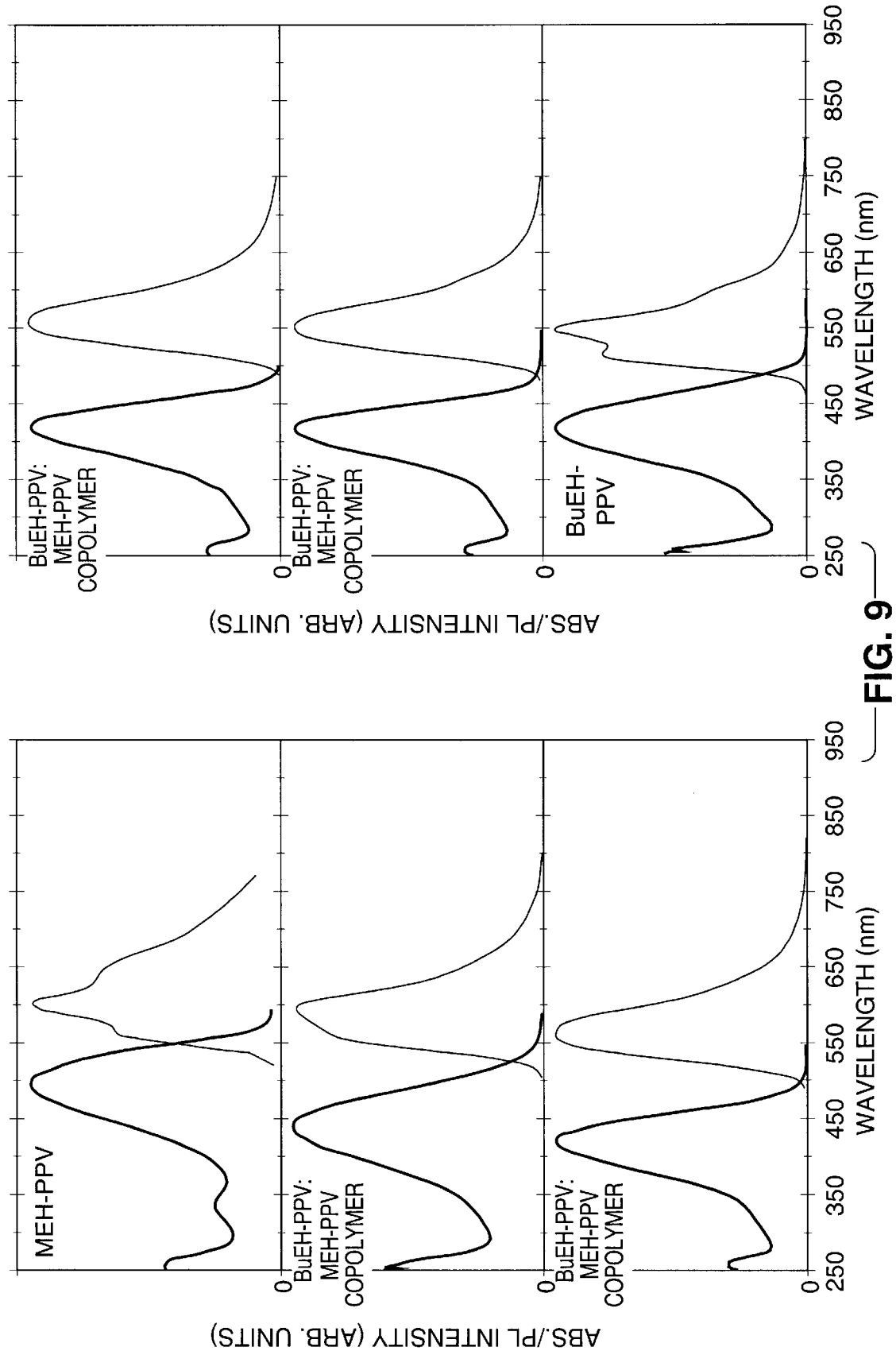
FIG. 9 is an absorption spectra and photoluminescence spectra of MEH-PPV, BuEH-PPV:MEH-PPV copolymers with the ratios 97.5:2.5; 95:5; 90:10; and 70:30 as compared to BuEH-PPV.

In this Example, we demonstrate that we can achieve fine-tuning of the color by using films of different semiconducting polymers. In this Example, copolymers consisting of different ratios of BuEH-PPV and MEH-PPV monomers were used for the luminescent polymer layer. The chemical structures, ground state absorption spectra, and steady state photoluminescence spectra of MEH-PPV and BuEH-PPV:MEH-PPV copolymers with the ratios 97.5:2.5, 95:5, 90:10, and 70:30 are shown in FIG. 9. The polymers were dissolved in p-xylene at concentrations of 1% w/v and spin cast into films in a manner similar to that described in Example 2. The films were pumped by the Zn-doped InGaN LED with peak emission at 470 nm (as described in Example 2). The spectra were recorded as described in Example 2. The corresponding CIE coordinates are tabulated below:

| BuEH:MEH ratio | CIE Coord. | $l_{max}$(absorption) | OD at $l_{max}$(absorption) |
| --- | --- | --- | --- |
| 97.5:2.5 | 0.252, 0.520 | 422 nm | 0.54 |
| 95:5 | 0.250, 0.515 | 426 nm | 0.44 |
| 90:10 | 0.258, 0.536 | 426 nm | 0.59 |
| 70:30 | 0.263, 0.520 | 442 nm | 0.42 |

Thus, by using the BuEH-PPV:MEH-PPV copolymer films in conjunction with the 470 nm Group III-nitride LED as both the pumping source and as a component in the recorded spectrum, very fine tuning of the color can be achieved.

Example 4

Figure 10:
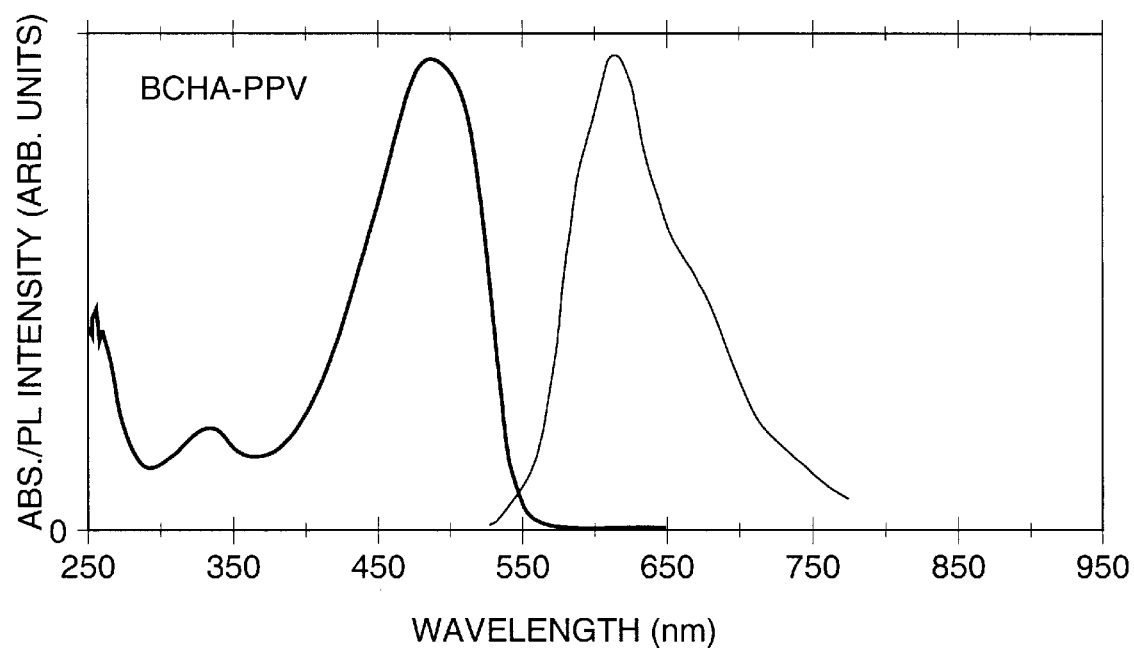
FIG. 10 is an absorption spectrum and photoluminescence spectrum of BCHA-PPV.

In this example, it is demonstrated that the color can be tuned simply by varying the thickness of the polymer film. This takes advantage of the high density of chromophores that can be achieved in neat films of semiconducting polymers and the inherently high absorption coefficients in this class of materials. Two BCHA-PPV films of different thicknesses were prepared (optical densities, OD, of 1.42 and 0.15). The absorption and photoluminescence spectra, and the chemical structure of BCHA-PPV are shown in FIG. 10.

The emission spectra of the 470 nm LED pumping the thick and thin films of BCHA-PPV were recorded. The differences in the spectra arising from the films with different thicknesses were easily seen; the corresponding CIE coordinates are tabulated below:

| Type of film | CIE Coord. | $l_{max}$(absorption) | OD at $l_{max}$(absorption) |
| --- | --- | --- | --- |
| thick | 0,418, 0.529 | 482 nm | 1.42 |
| thin | 0.243, 0.469 | 492 nm | 0.15 |

We observed very clearly that as the BCHA-PPV film was made thicker, the orange part of the spectrum was enhanced whereas the green part was suppressed as a result of the enhanced absorption of the 470 nm LED emission by the BCHA-PPV film.

Example 5

In this example, it is demonstrated that significant color changes can be achieved by using a red emitting polymer with an absorption overlapping the emission of the 470 nm LED. In this case, a film of MEH-PPV spin-cast from p-xylene was used in a manner similar to that described in Example 2. Optical density (OD)=1.07 at $l_{max}$(absorption)= 490 nm. The spectrum was recorded; there is a significant red component to the emission which makes the color appear to the eye as a faint whitish red. The CIE coordinates were (0.407, 0.464).

Example 6

In this example, it is demonstrated the possibility of achieving not only color tunability but also white light by means of a judicious choice of LED optical pump source and a suitable combination of semiconducting polymer films.

Instead of a 470 nm LED, we used another Group III-nitride LED which uses InGaN quantum wells. This LED was driven at a current of 8 mA. The emission spectrum was recorded. The emission peaked at 450 nm, with corresponding CIE coordinates of (0.166, 0.072). The emission from the 450 nm LED appears more blue to the eye than that of the 470 nm LED.

Several films were prepared by spin-casting in the standard manner: including a film of BuEH-PPV (OD=0.95 at $l_{max}$(absorption)=416 nm), and two films of MEH-PPV of different thicknesses (thick film: OD=0.68 at $l_{max}$(absorption)=492 nm; thin. film: OD=0.46 at $l_{max}$(absorption)=496 nm) Each film was spin-cast on a separate glass substrate. The optical characterization was performed in a similar manner, with the exception that two films, a BuEH-PPV film and an MEH-PPV film, were placed simultaneously in the optical path of the 450 nm LED, with the BuEH-PPV film being closer to the 450 nm LED pump source.

The spectra were obtained and analyzed; the corresponding CIE coordinates are (0.295, 0.273) for the thin MEH-PPV film and (0.339, 0.290) for the thick MEH-PPV film. To the eye, both appeared to be white, thus confirming that by judicious choice of polymer film materials and film thicknesses the color can be tuned as desired and that white light can be achieved. The configuration with the thick MEH-PPV film is very close to the CIE equienergy point of (0.333, 0.333), which is designated as pure white.

Example 7

In this example, it is demonstrated that the color tunability described in Example 6 can also be achieved by employing a multilayer polymer film, in which the film comprises layers of different polymers. Alternatively, it is possible to make polymer blends comprising different semiconducting polymers. When a polymer blend film is pumped by an LED, the polymer that is strongly absorptive in the emission region of the pumping LED absorbs the light and emission takes place primarily from the lower energy gap polymer.

In order to make multilayer films by spin casting, solvents must be chosen such that the solvent for the upper layer does not dissolve the previously deposited underlying polymer layer. In this example, films of BuEH-PPV were spin-cast from p-xylene solutions in the standard manner, and allowed to dry. Cyclohexanone was chosen as a solvent for MEH-PPV, since it dissolves MEH-PPV but does not dissolve BuEH-PPV. MEH-PPV was spin-cast from cyclohexanone on top of the BuEH-PPV films. Four (4) films with the same BuEH-PPV thickness but with different MEH-PPV thicknesses were prepared in this manner. Emission spectra were obtained from each of these four samples. As the MEH-PPV layer thickness was increased, the relative weight of red emission was observed to increase. The corresponding CIE coordinates were:

| Sample # | CIE Coord. | $l_{max}$(absorption) | OD at $l_{max}$(absorption) |
| --- | --- | --- | --- |
| 1 | 0.548, 0.380 | 450 nm | 2.81 |
| 2 | 0.482, 0.346 | 438 nm | 2.43 |

-continued

| Sample # | CIE Coord. | l$_{max}$(absorption) | OD at l$_{max}$(absorption) |
|---|---|---|---|
| 3 | 0.413, 0.320 | 432 nm | 2.16 |
| 4 | 0.309, 0.264 | 424 nm | 1.94 |

It is clear that the bilayer or multilayer approach described in this Example is effective in achieving the desired color tunability, including the emission of white light.

What is claimed is:

1. A hybrid solid state light-emitting device comprising
an electrically-powered, solid state, inorganic, light emitter capable of emitting a first emitted output of light and
a photoluminescent polymer element positioned in the first emitted output of light, the polymer element comprising a photoluminescent conjugated semiconducting polymer which is pumped by a first portion of the first emitted output of light and when so pumped emits a second emitted output of light which is emitted from the device with that portion of the first emitted output if any remaining beyond the first portion.

2. The hybrid solid state light-emitting device of claim 1 wherein the electrically-powered, solid state, inorganic, light emitter is selected from the group consisting of a p-n junction diode-containing light emitter, a p-i-n junction triode-containing light emitter, a p-n junction laser diode light emitter, a metal-insulator-semiconductor (M-I-S)-containing light emitter, and a semiconductor quantum cascade pump source light emitter.

3. The hybrid solid state light-emitting device of claim 2 wherein the electrically-powered, solid state, inorganic, light emitter is a p-n junction light emitting diode.

4. The hybrid solid state light-emitting device of claim 3 wherein the p-n junction light emitting diode is a Group III-nitride p-n junction light-emitting diode.

5. The hybrid solid state light-emitting device of claim 2 wherein the electrically-powered, solid state, inorganic, light emitter is a p-i-n junction triode-containing light emitter.

6. The hybrid solid state light-emitting device of claim 5 wherein the electrically-powered, solid state, inorganic, light emitter is a p-i-n junction light emitting triode.

7. The hybrid solid state light-emitting device of claim 6 wherein the p-i-n junction light emitting triode is a Group III-nitride p-n junction light-emitting triode.

8. The hybrid solid state light-emitting device of claim 2 wherein the electrically-powered, solid state, inorganic, light emitter is a p-n junction laser diode light emitter.

9. The hybrid solid state light-emitting device of claim 8 wherein the p-n junction laser diode is a Group III-nitride p-n junction laser diode.

10. The hybrid solid state light-emitting device of claim 2 wherein the electrically-powered, solid state, inorganic, light emitter is a metal-insulator-semiconductor (M-I-S)-containing light emitter.

11. The hybrid solid state light-emitting device of claim 2 wherein the electrically-powered, solid state, inorganic, light emitter is a semiconductor quantum cascade pump source light emitter.

12. The hybrid solid state light-emitting device of claim 4 wherein the Group III-nitride p-n junction light-emitting diode comprises a (In,Ga)N alloy system.

13. The hybrid solid state light-emitting device of claim 4 wherein the Group III-nitride p-n junction diode comprises group III-nitride grown by metal organic chemical vapor deposition (MOCVD).

14. The hybrid solid state light-emitting device of claim 3 wherein the p-n junction diode-containing device is a SiC or II-VI compound semiconductor-containing p-n junction light-emitting diode.

15. The hybrid solid state light-emitting device of claim 14 wherein the II-VI compound semiconductor is ZnSe.

16. The hybrid solid state light-emitting device of claim 1 wherein the photoluminescent polymer element is a thin film through which that portion of the first emitted output remaining beyond the first portion passes.

17. The hybrid solid state light-emitting device of claim 1 wherein the photoluminescent polymer element is a polymer body through which that portion of the first emitted output remaining beyond the first portion passes.

18. The hybrid solid state light-emitting device of claim 1 wherein the photoluminescent polymer element is a polymer body into which the first portion of the first emitted output is absorbed.

19. The hybrid solid state light-emitting device of claim 1 wherein the first emitted output of light and the second emitted output of light have different wavelengths.

20. The hybrid solid state light-emitting device of claim 19 wherein the wavelengths of the first emitted output of light and the second emitted output of light are selected to produce a white light for the combined emission.

21. The hybrid solid state light-emitting device of claim 1 wherein the conjugated semiconducting polymer has a band gap of from about 1 to about 3 eV.

22. The hybrid solid state light-emitting device of claim 21 wherein the conjugated semiconducting polymer has a photoluminescence quantum efficiency greater than 10%.

23. The hybrid solid state light-emitting device of claim 21 wherein the conjugated semiconducting polymer has a photoluminescence quantum efficiency greater than 50%.

24. The hybrid solid state light-emitting device of claim 1 wherein the photoluminescent polymer element additionally comprises light scattering particles in admixture with the photoluminescent conjugated semiconducting polymer.

25. The hybrid solid state light-emitting device of claim 21 wherein the conjugated semiconducting polymer is selected from the group of a conjugated semiconducting polymer with the poly(phenylenevinylene) backbone molecular structure, a conjugated semiconducting polymer with the poly(phenylenevinylene) backbone molecular structure and functionalized with side chains to make it soluble in common organic solvents, a conjugated semiconducting polymer with the poly(phenylene) backbone molecular structure, a conjugated semiconducting polymer with the poly(phenylene) molecular structure and functionalized with side chains to make it soluble in common organic solvents, a conjugated semiconducting polymer with the poly(fluorene) backbone molecular structure, and a conjugated semiconducting polymer with the poly(fluorene) backbone molecular structure and functionalized with side chains to make it soluble in common organic solvents.

26. A hybrid solid state light-emitting device comprising
an electrically-powered, solid state, inorganic, light emitter capable of emitting a first emitted output of light and
a photoluminescent polymer element positioned in the first emitted output of light, the polymer element comprising a saturated polymer mixed with luminescent dyes or a saturated polymer having a saturated main chain with luminescent dye molecules attached to the main chain via side-chains which is pumped by a first portion of the first emitted output of light and when so pumped emits a second emitted output of light which is emitted from the device with that portion of the first emitted output remaining beyond the first portion.

27. The hybrid solid state light-emitting device of claim 1 wherein the first emitted output of light is blue-green or blue light.

28. The hybrid solid state light-emitting device of claim 1 additionally comprising a lens positioned in the first emitted output of light.

29. The hybrid solid state light-emitting device of claim 28 wherein the photoluminescent polymer element is attached to the lens.

30. The hybrid solid state light-emitting device of claim 29 wherein the photoluminescent polymer element is a coating attached to the lens.

31. The hybrid solid state light-emitting device of claim 30 wherein the lens has an inner surface adjacent to the p-n junction diode device and an exterior surface and wherein the coating is on the exterior surface.

32. The hybrid solid state light-emitting device of claim 31 additionally comprising a hardcoat upon the coating of photoluminescent polymer.

33. The hybrid solid state light-emitting device of claim 1 wherein the photoluminescent polymer element is the gain medium in a resonant structure and the p-n junction diode device and the photoluminescent polymer are selected so that the p-n junction diode device's first emitted output of light pumps the photoluminescent polymer element above its threshold for lasing.

34. The hybrid solid state light-emitting device of claim 33 wherein the resonant structure is a planar waveguide.

35. The hybrid solid state light-emitting device of claim 33 wherein the planar waveguide has distributed feedback.

36. The hybrid solid state light-emitting device of claim 33 wherein the resonant structure is a channel waveguide.

37. The hybrid solid state light-emitting device of claim 33 wherein the channel waveguide has distributed feedback.

38. The hybrid solid state light-emitting device of claim 33 wherein the resonant structure is a microcavity.

* * * * *